IMAGE

US010317492B2

(12) United States Patent
Pfeuffer et al.

(10) Patent No.: US 10,317,492 B2
(45) Date of Patent: Jun. 11, 2019

(54) MAGNETIC RESONANCE DATA ACQUISITION METHOD AND APPARATUS SATURATION WITH SPIN DEPENDENT ON THE ANATOMICAL STRUCTURES TO BE IMAGED

(71) Applicant: Siemens Aktiengesellschaft, Munich (DE)

(72) Inventors: Josef Pfeuffer, Kunreuth (DE); Rainer Schneider, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 359 days.

(21) Appl. No.: 15/085,228

(22) Filed: Mar. 30, 2016

(65) Prior Publication Data
US 2016/0291111 A1 Oct. 6, 2016

(30) Foreign Application Priority Data

Mar. 30, 2015 (DE) .................. 10 2015 205 694

(51) Int. Cl.
*G01R 33/56* (2006.01)
*G01R 33/483* (2006.01)
*G01R 33/54* (2006.01)

(52) U.S. Cl.
CPC ..... *G01R 33/5607* (2013.01); *G01R 33/4838* (2013.01); *G01R 33/543* (2013.01)

(58) Field of Classification Search
CPC ............ G01R 33/5608; G01R 33/5611; G01R 33/4835; G01R 33/543; G01R 33/4828
USPC ........................................................ 324/309
See application file for complete search history.

(56) References Cited

U.S. PATENT DOCUMENTS

| 6,952,097 | B2 | 10/2005 | Schreck et al. | |
|---|---|---|---|---|
| 8,633,690 | B2* | 1/2014 | Feiweier | G01R 33/54 324/307 |
| 8,680,860 | B2* | 3/2014 | Xu et al. | G01R 33/5607 324/309 |
| 9,599,692 | B2* | 3/2017 | Ritter | G01R 33/4838 |
| 2003/0117136 | A1* | 6/2003 | Wang et al. | G01R 33/5676 324/306 |
| 2003/0139659 | A1 | 7/2003 | Dale et al. | |

(Continued)

OTHER PUBLICATIONS

Zhao, Feng, Jon-Fredrik Nielsen, and Douglas C. Noll. "Four dimensional spectral-spatial fat saturation pulse design." Magnetic resonance in medicine 72.6 (2014): 1637-1647.*

(Continued)

*Primary Examiner* — Christopher P McAndrew
(74) *Attorney, Agent, or Firm* — Schiff Hardin LLP

(57) ABSTRACT

In a method, computer and magnetic resonance imaging system for determining a control sequence for operating the magnetic resonance imaging system to generate magnetic resonance image data of a region to be imaged of an examination subject, from which magnetic resonance raw data are acquired, information describing the anatomical structure of the region to be imaged is made available in the computer, and a surrounding area and a central area are specified in the region to be imaged dependent on the determined anatomical structure. Furthermore, a one-dimensional water/fat saturation pulse sequence for saturating the surrounding areas is determined and a multidimensional water/fat saturation pulse sequence for saturating the central area is determined.

14 Claims, 11 Drawing Sheets

(56) References Cited

U.S. PATENT DOCUMENTS

| | | | |
|---|---|---|---|
| 2010/0127703 | A1 | 5/2010 | Sung et al. |
| 2010/0286802 | A1* | 11/2010 | Feiweier .............. G01R 33/54 700/90 |
| 2011/0152669 | A1 | 6/2011 | Kassai |
| 2012/0146638 | A1* | 6/2012 | Xu et al. ............ G01R 33/4838 324/309 |
| 2012/0161764 | A1* | 6/2012 | Ritter ................. G01R 33/4836 324/309 |
| 2012/0197103 | A1 | 8/2012 | Sorensen |
| 2012/0226141 | A1* | 9/2012 | Shinoda ................. G01R 33/48 600/419 |
| 2012/0295960 | A1* | 11/2012 | Palfi ..................... A61K 48/005 514/44 R |
| 2013/0038640 | A1 | 2/2013 | Kajimoto |
| 2013/0249550 | A1 | 9/2013 | Feiweier et al. |
| 2013/0278259 | A1* | 10/2013 | Greiser ................. G01R 33/50 324/309 |
| 2014/0002077 | A1 | 1/2014 | Deshpande et al. |
| 2014/0275962 | A1* | 9/2014 | Foo ........................ A61N 2/002 600/411 |
| 2014/0361772 | A1* | 12/2014 | Ritter ................. G01R 33/4838 324/309 |
| 2014/0375316 | A1* | 12/2014 | Fenchel ............. G01R 33/4816 324/309 |
| 2015/0078644 | A1* | 3/2015 | Park ....................... A61B 5/055 382/131 |

OTHER PUBLICATIONS

Singh, Saryu, and Roxanne Deslauriers. "Selective saturation of volumes of tailored shape for black blood magnetic resonance angiography." Concepts in Magnetic Resonance8.1 (1996): 33-48. (Year: 1996).*

Zhao, Feng, Jon-Fredrik Nielsen, and Douglas C. Noll. "Four dimensional spectral-spatial fat saturation pulse design." Magnetic resonance in medicine 72.6 (2014): 1637-1647 (Year: 2014).*

Zhao, Feng, Jon-Fredrik Nielsen, and Douglas C. Noll. "Four dimensional spectral-spatial fat saturation pulse design." Magnetic resonance in medicine 72.6 (2014): 1637-1647. (Year: 2014).*

Singh, Saryu, and Roxanne Deslauriers. "Selective saturation of volumes of tailored shape for black blood magnetic resonance angiography." Concepts in Magnetic Resonance 8.1 (1996): 33-48.) (Year: 1996).*

Schneider et al., "Shaped Saturation with Inherent Radiofrequency-Power-Efficient Trajectory Design in Parallel," Magnetic Resonance in Medicine, vol. 72, pp. 1015-1027 (2014).

Setsompop et al., "Broadband Slab Selection with B+1 Mitigation at 7T via Parallel Spectral-Spatial Excitation," Magnetic Resonance in Medicine, vol. 61, pp. 493-500 (2009).

Schneider et al., "Selective MR imaging and off-resonance correction with parallel transmission at 3T," 17th Ann. Meet. Ger. Chapter Int. Soc. Magn. Reson. Med., pp. 35-39 (2014).

* cited by examiner

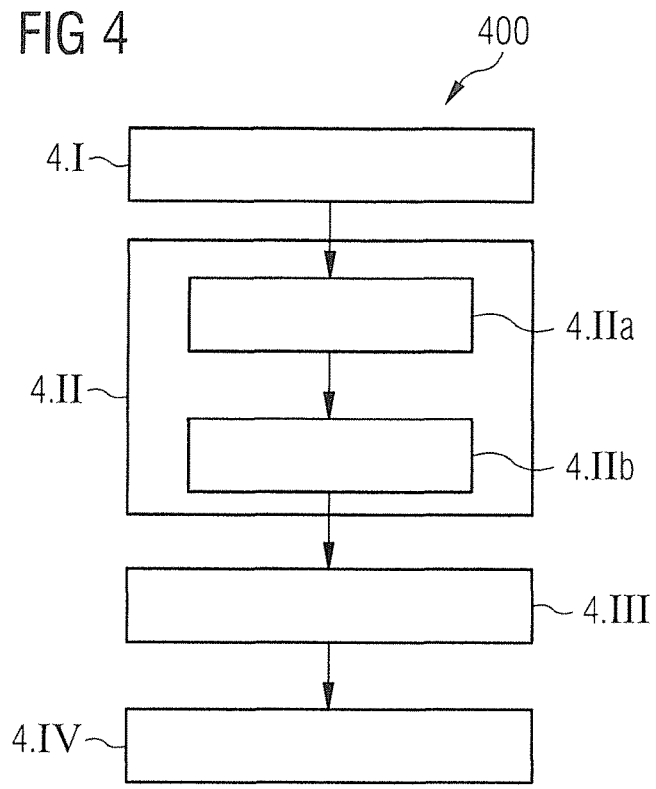
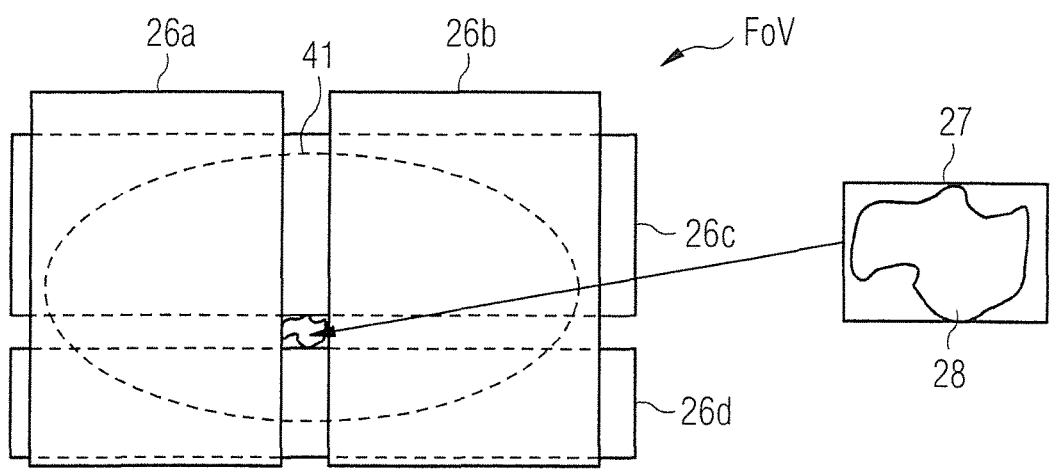

MAGNETIC RESONANCE DATA ACQUISITION METHOD AND APPARATUS SATURATION WITH SPIN DEPENDENT ON THE ANATOMICAL STRUCTURES TO BE IMAGED

BACKGROUND OF THE INVENTION

Field of the Invention

The present invention concerns a method for determining a control sequence for operating a magnetic resonance (MR) imaging system in order to generate magnetic resonance image data of a region to be imaged of an examination subject, wherein magnetic resonance raw data are acquired. The invention furthermore concerns a method for controlling a magnetic resonance imaging system in order to generate magnetic resonance image data of an examination subject, in which method magnetic resonance raw data are acquired. The invention also concerns a radio-frequency (RF) saturation pulse sequence determination system. The invention additionally concerns to a magnetic resonance imaging system.

Description of the Prior Art

In magnetic resonance imaging, it is often necessary to suppress unwanted signals in order to prevent the unwanted signals from being superimposed on the signals from a region that is to be imaged. In the imaging of the spine, for example, signals from moving internal organs and fat of the abdominal wall lead to severe motion and flow artifacts in the phase-encoding direction which obscure the part of the spine that is to be imaged. Fat signals of the abdomen/chest region have a similar effect on image quality in cardiac imaging. It is therefore necessary to saturate these regions which affect the imaging due to sources of interference during the imaging session in order to achieve good image quality and enable a meaningful diagnosis to be made. Typically, the region-specific saturation is achieved as follows. Prior to the actual pulse sequence for acquiring the raw data to be used for the magnetic resonance image generation, an RF pulse with a 90° flip angle is first generated that puts the signal of a specific region into the state of maximum transverse magnetization. Field gradients called spoiler gradients are then generated, by which the transverse magnetization of the region in question is nulled, thereby preventing it from influencing the subsequent imaging operation.

A successful design and application of an RF saturation pulse is dependent on a variety of factors:

One factor relates to anatomical accuracy. The more anatomically accurate the water or fat saturation proves to be, i.e. the more precisely a region from which spurious signals are to be expected is targeted by the water/fat saturation, the fewer spurious signals are to be expected, which leads to an improvement in image quality. What would be most effective, insofar as this factor is concerned, would be the application of RF saturation pulses by which arbitrarily shaped sub-areas of a region to be imaged FoV (Field of View) can be saturated.

A further factor relates to the B1+ sensitivity of the RF excitation coils of the magnetic resonance system. The RF excitation coils have a spatially varying excitation sensitivity that differs dependent on the object to be imaged and the region to be imaged. For this reason the spatial flip angle distribution of the saturation pulse can deviate significantly from the desired 90° angle. From this non-uniform distribution, a residual transverse magnetization results, which in turn causes unwanted artifacts, albeit in attenuated form.

Another factor relates to detuning effects known as off-resonance effects. Here, the static $B_0$ field exhibits spatial deviations as a consequence of technical inaccuracies of the basic field magnet and patient-specific magnetic susceptibility. This results in unwanted frequency shifts, and phase errors develop that in turn adversely affect the accuracy and effectiveness of the RF saturation pulse.

Finally, the configuration of the RF saturation pulses is also influenced by the specific absorption rate (SAR). RF saturation pulses are associated with a high SAR, since a high flip angle of 90° is generated during the water/fat saturation. Furthermore, the RF saturation pulses must be set prior to each pulse sequence section, i.e. in each repetition time interval TR, which necessitates high repetition rates and leads to a very high SAR over a relatively long period of time.

Conventionally, broadband 1D RF saturation pulses are used for spurious signal suppression. The bandwidth of the saturation pulses is chosen so that fat and water signals will be nulled. A typical bandwidth value is in the region of 3.5 ppm. The saturation profile is one-dimensional, i.e. a slice-by-slice or slice-selective saturation is achieved. Consequently, many of these saturation pulses must be arranged manually in order to fit them to a desired anatomy. The conventional broadband 1D RF saturation pulses are associated with the following disadvantages. A lack of anatomical accuracy occurs even when the saturation pulses are aligned automatically. The broadband 1D RF saturation pulses are associated with a high SAR load, since very many successive pulses must be applied. The saturation is highly $B_1$-sensitive, because the coil profile of the excitation coils is not taken into account as well during the design of the saturation pulses. There is often a failure to consider any type of information with respect to the anatomy, for example on the basis of existing auto-align algorithms (see, for example, U.S. Pat. No. 6,952,097 B2 or US 2003/0139659 A1). The advantages of the application of one-dimensional saturation pulses consist in the individual RF saturation pulses being of relatively short duration. Furthermore, the saturation is fairly robust against off-resonance effects owing to the wide bandwidth of the saturation pulses. Finally, the saturation of large-volume regions is extremely effective.

Alternatively, pulses called multidimensional spatially selective RF saturation pulses have been developed by which arbitrarily shaped regions can be saturated.

The application of such multidimensional spatially selective RF saturation pulses is described in Schneider et al, "Shaped Saturation with Inherent Radiofrequency-Power-Efficient Trajectory Design in Parallel Transmission", in: Magnetic Resonance in Medicine, 2013, pp. 1-13, DOI: 10.1002/mrm.25016.

The $B_1$ excitation profiles and $B_0$ inhomogeneities are also taken into consideration in the application of such saturation pulses, and arbitrary two-dimensional or multidimensional saturation patterns can be realized. However, these multidimensional spatially selective RF saturation pulses are also associated with disadvantages. The pulse length of the individual saturation pulses can be very long and consequently can increase the repetition time. This problem can be compensated by the introduction of a parallel transmission technology (pTX), as a result of which the pulses can be shortened. The pulses can only be shortened to a certain degree, however. RF wave-chain hardware limitations are the strongest limiting factor in this case. Significant reductions in RF pulse length are prevented as a result of this limitation, in particular when a fairly extensive region is to be saturated, as is the case, for example, in spine imaging.

Furthermore, the pulse bandwidth of the multidimensional spatially selective RF saturation pulses is by nature quite small. In spite of $B_0$ inhomogeneities being taken into consideration in the RF pulse optimization process, the bandwidth, and consequently the robustness, of these pulses in respect of these effects is quite limited. In the imaging of the spine, for example, the $B_0$ inhomogeneities can fluctuate at the respiratory frequency of 50 Hz. If the pulses are optimized with a wider bandwidth of the pulse frequency, the computing time and the RF pulse lengths are greatly increased.

An optimization of the pulses by means of a wider bandwidth is described in Setsompop et al., "Broadband Slab Selection with B+1 Mitigation at 7T via Parallel Spectral-Spatial Excitation", in: Magnetic Resonance in Medicine, Issue 61, 2009, pages 492-500, DOI:10.1002/mrm.21834.

Furthermore, the design of the multidimensional spatially selective RF saturation pulses is dependent on the $B_1$ profiles and the $B_0$ inhomogeneity data, i.e. what is termed the adjustment data (Adj dat). Particularly in the imaging of the spine, no body matrix reception coil is used in order to suppress the signal from the abdominal wall. In this case it is not possible to acquire suitable adjustment data covering the entire abdominal region. This is due to the fact that, as a result of the low signal intensity of the signals from the abdominal wall region, particularly when very corpulent patients are examined, the signals from such a region are too weak. Consequently, the multidimensional spatially selective RF saturation pulses cannot be designed with sufficient accuracy to compensate for all the remaining spurious signals. However, the saturation with the aid of multidimensional, spatially selective RF saturation pulses also affords advantages. A high degree of anatomical accuracy is achieved in the saturation, wherein arbitrarily shaped saturation regions can be realized and the specification of the saturation regions can be combined well with existing auto-align algorithms. Accordingly, only a single pulse is required, rather than multiple pulses. The sequence is very SAR-efficient, i.e. the SAR load can be kept low. This can be achieved in particular in combination with the pTX technology. The values of the flip angles can be precisely predetermined over the entire region to be imaged. This can be achieved because the $B_1$ profile is also incorporated into the pulse optimization process.

SUMMARY OF THE INVENTION

An object of the present invention is to provide an MR imaging method having a control sequence by which the cited disadvantages in the case of the described saturation methods can be at least partially compensated.

In the method according to the invention for determining a control sequence for controlling a magnetic resonance imaging system in order to generate magnetic resonance image data of a region to be imaged of an examination subject, from which magnetic resonance raw data are acquired, information is determined with respect to the anatomical structure of the region to be imaged of the examination subject. This information can be obtained, for example, from a type of overview image that has been generated prior to the actual image acquisition of the examination subject.

A surrounding area and a central area are then specified in the region to be imaged dependent on the determined anatomical structure. The surrounding area and the central area may overlap one another. In this case the central area includes the object or volume area to be imaged located in the center of interest. The central area can, but does not have to, form the geometric center of the region to be imaged. Generally, in this context, the term "center" is not to be understood primarily in geometric terms, but in the sense that there is where the object to be imaged placed in the center of interest is localized. By the surrounding area is to be understood the periphery or the subarea of the region to be imaged that is complementary to the central area. In this case the surrounding area can include multiple surrounding areas, which may also overlap or partly cover one another. It can also include the geometric center of the region to be imaged (which is not to be confused with the above-defined central area). The surrounding area typically includes the sections of the region to be imaged that are not located in the center of interest, but nonetheless also contribute to spurious signals and artifacts. For this reason the sub-areas must also be saturated before the actual image acquisition sequence is initiated. For this purpose a one-dimensional saturation pulse sequence is determined for saturating the surrounding area. A one-dimensional saturation pulse sequence means a saturation pulse sequence that saturates a region that is limited in one dimension only. Furthermore, a multidimensional saturation pulse sequence is determined in addition for the purpose of saturating the central area. This is because materials such as fat and water, which cause spurious signals during the MR imaging, may also be contained in the central area. Normally, quite accurate data known as adjustment data is available for the central areas to be imaged, said data containing information with regard to the distribution of the basic magnetic field $B_0$ and the distribution of the $B_1$ sensitivity of the imaging magnetic resonance system. Advantageously, the time-consuming delivery of the nD saturation pulse sequences, which is highly sensitive to fluctuations in magnetic fields, is restricted to the central area of the region to be imaged, whereas the environment surrounding the central area is saturated with the aid of the more robust but generally less precise 1D saturation pulse sequences. In this way the advantages of both types of saturation pulses can be combined with one another and tailored to individual requirements. By a multidimensional nD saturation pulse sequence is to be understood a saturation pulse sequence by means of which a multidimensionally limited region can be saturated.

In the method according to the invention for controlling a magnetic resonance imaging system in order to generate magnetic resonance image data of an examination subject, in which method magnetic resonance raw data are acquired, an RF excitation pulse is generated in an excitation operation. The method according to the invention also includes a readout operation in which an RF refocusing pulse is generated and RF signals for the acquisition of magnetic resonance raw data are captured. The method according to the invention furthermore comprises a step for generating saturation pulses that have been determined by the method according to the invention for determining a control sequence for controlling a magnetic resonance imaging system in order to generate magnetic resonance image data of a region to be imaged of an examination subject.

The RF saturation pulse sequence determination device according to the invention comprises an input interface for acquiring information in respect of the anatomical structure of a region to be imaged of an examination subject. In addition, the RF saturation pulse sequence determination device according to the invention includes a saturation region specification device for specifying a surrounding area and a central area in the region to be imaged as a function of the determined anatomical structure. Furthermore, a 1D saturation pulse determination device for determining a one-dimensional water/fat saturation pulse sequence for saturating the surrounding area and an nD saturation pulse determination device for determining a multidimensional water/fat saturation pulse sequence for saturating the central area are also part of the RF saturation pulse sequence determination device according to the invention.

The magnetic resonance imaging system according to the invention has a control computer that is configured to operate the scanner of the magnetic resonance imaging system using the method according to the invention. In this arrangement, the magnetic resonance tomography system according to the invention has an RF saturation pulse sequence determination processor according to the invention.

The majority of the basic components of the RF saturation pulse sequence determination processor according to the invention can be embodied in the form of software components. This relates in particular to the saturation region specification processor, the 1D saturation pulse determination processor and the nD saturation pulse determination device. In principle, however, some of these components can also be realized in the form of software-assisted hardware, for example FPGAs or the like, in particular when extremely fast calculations are involved. Equally, the required interfaces can be embodied as software interfaces, for example when it is simply a matter of importing data from other software components. They can, however, also be embodied as hardware-based interfaces which are controlled by means of suitable software.

A largely software-based implementation has the advantage that control devices already used in the prior art can also be easily upgraded by a software update in order to operate in the inventive manner. In that respect, the aforementioned object is also achieved by a non-transitory, computer-readable data storage medium encoded with programming instructions, the storage medium is loadable directly into a memory of a control computer of a magnetic resonance imaging system. The program having instructions causes all the steps of the inventive method to be implemented when the program code is executed in the control device. The storage medium may also be encoded with additional parts such as e.g. documentation and/or other components, and may include hardware components, such as e.g. hardware keys (dongles, etc.) to allow use of the program code.

The computer-readable medium may be, for example, a memory stick, a hard disk or some other portable or permanently installed data medium.

In the following description, advantageous embodiments and developments of the invention are described. The various features of different exemplary embodiments can be combined within the scope of the invention to produce further exemplary embodiments.

In an embodiment of the method according to the invention, the anatomical structure information is obtained with the use of an automatic segmentation. An automatic segmentation can be performed, for example, in advance with the use of scan data acquired at a low resolution for the purpose of selecting a field of view that is to be imaged. This scan, which is thus already available in advance, can be used also for the acquisition of the anatomical structure information.

In a preferred embodiment of the method according to the invention, the anatomical structure information is obtained in connection with the performance of an auto-align method. In this variant as well, there is no need for additional acquisitions in order to obtain the anatomical structure information, with the result that an additional SAR loading of the patient to be examined can be avoided.

In another preferred embodiment of the method according to the invention, the method is performed in a fully automated manner through parameterization of acquired anatomical coordinates and subsequent spatial adaptation of the different 1D RF saturation pulses and nD RF saturation pulses to fit the parameterized anatomical structure. An automated implementation of the method according to the invention reduces the requirements in terms of the qualification of the operating staff and speeds up the performance of the entire image acquisition process.

In a variant of the method according to the invention, the 1D RF saturation pulses are aligned along the tangent of a geometric curve in a maximum of six directions and the nD saturation pulses are then used in order to image the remaining fine structures in the central area.

In a particularly effective variant of the method according to the invention, sub-areas of the region to be imaged with insufficient coverage by $B_1/B_0$ maps are saturated with the use of 1D RF saturation pulses, since regions in which no adjustment data is present cannot be saturated as effectively by means of multidimensional saturation pulses, because the latter react very sensitively to deviations in $B_1$ sensitivity and $B_0$ basic magnetic field distribution. An application of the very robust 1D RF saturation pulses in these regions ensures an optimal saturation under these conditions and at the same time speeds up the saturation process.

In an alternative, likewise very effective variant of the method according to the invention, the surrounding areas are embodied according to the criterion of the smallest possible overlap with one another and the smallest possible overall surface area. In this variant, the method is optimized in terms of reducing SAR loading to a minimum.

In an alternative embodiment of the method according to the invention, adjustment data are used that include $B_0$ maps and S1 magnitude maps and S2 magnitude maps, preferably obtained with the execution of Bloch simulations, which relate to the $B_1$ sensitivity of the antenna coils, referred to as $B_1$ maps for short, in order to simulate a 1D saturation in the surrounding area. In addition, a map of the residual signal complementary to the determined 1D saturation is generated. The map of the residual signal is then integrated into an nD saturation target map for an nD saturation signal that is to be generated. Finally, nD saturation signal pulse sequences are determined on the basis of the nD saturation target map for the surrounding area and the central area. In this embodiment the precision of the saturation in the surrounding area is also optimized in addition.

Alternatively or in addition, the method according to the invention can be used for generating a pulse sequence that is optimized in terms of a minimum duration of the RF saturation pulses.

In addition, in the method according to the invention, a user interface can be used to select different saturation pulse sequences in order to allow a possible setting by the user.

BRIEF DESCRIPTION OF THE DRAWINGS

FIG. 4 is a flowchart illustrating a method for determining a control sequence for controlling a magnetic resonance imaging system by a saturation pulse sequence according to a second exemplary embodiment of the invention.

FIG. 5 is a schematic illustration of the application of 1D saturation pulses and nD saturation pulses to the region to be examined in the method according to a second exemplary embodiment of the invention, in a mode called the default mode.

DESCRIPTION OF THE PREFERRED EMBODIMENTS

Figure 1:
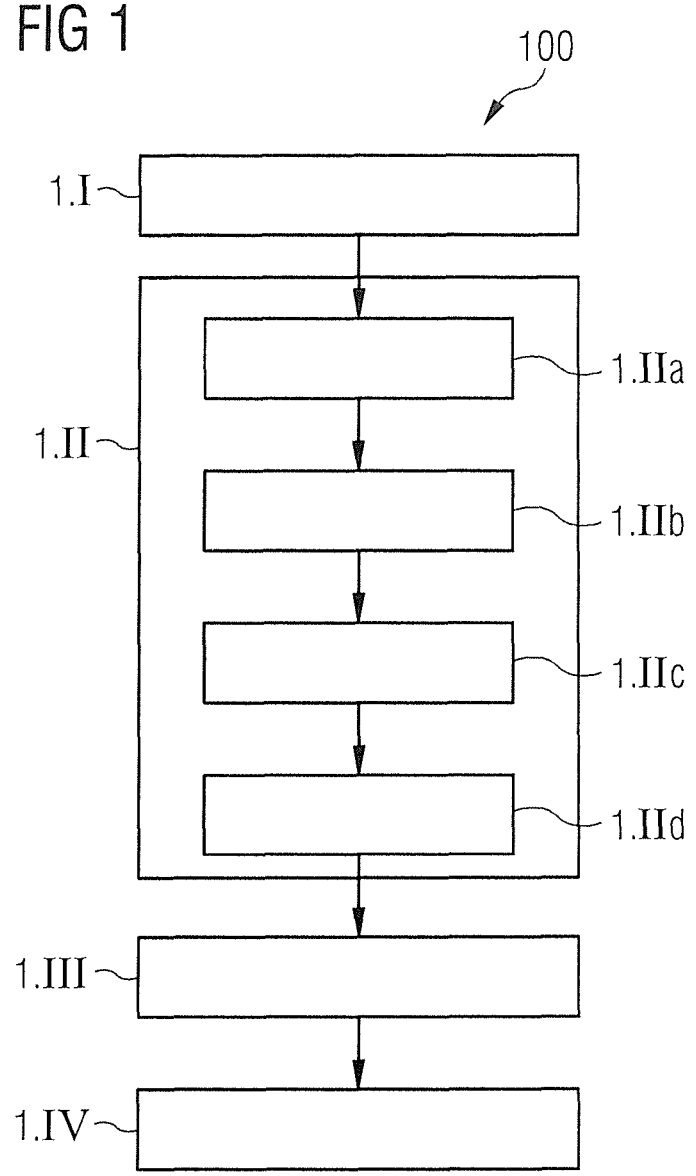
FIG. 1 is a flowchart illustrating a method for determining a control sequence for controlling a magnetic resonance imaging system by a saturation pulse sequence according to an exemplary embodiment of the invention.
Figure 2:
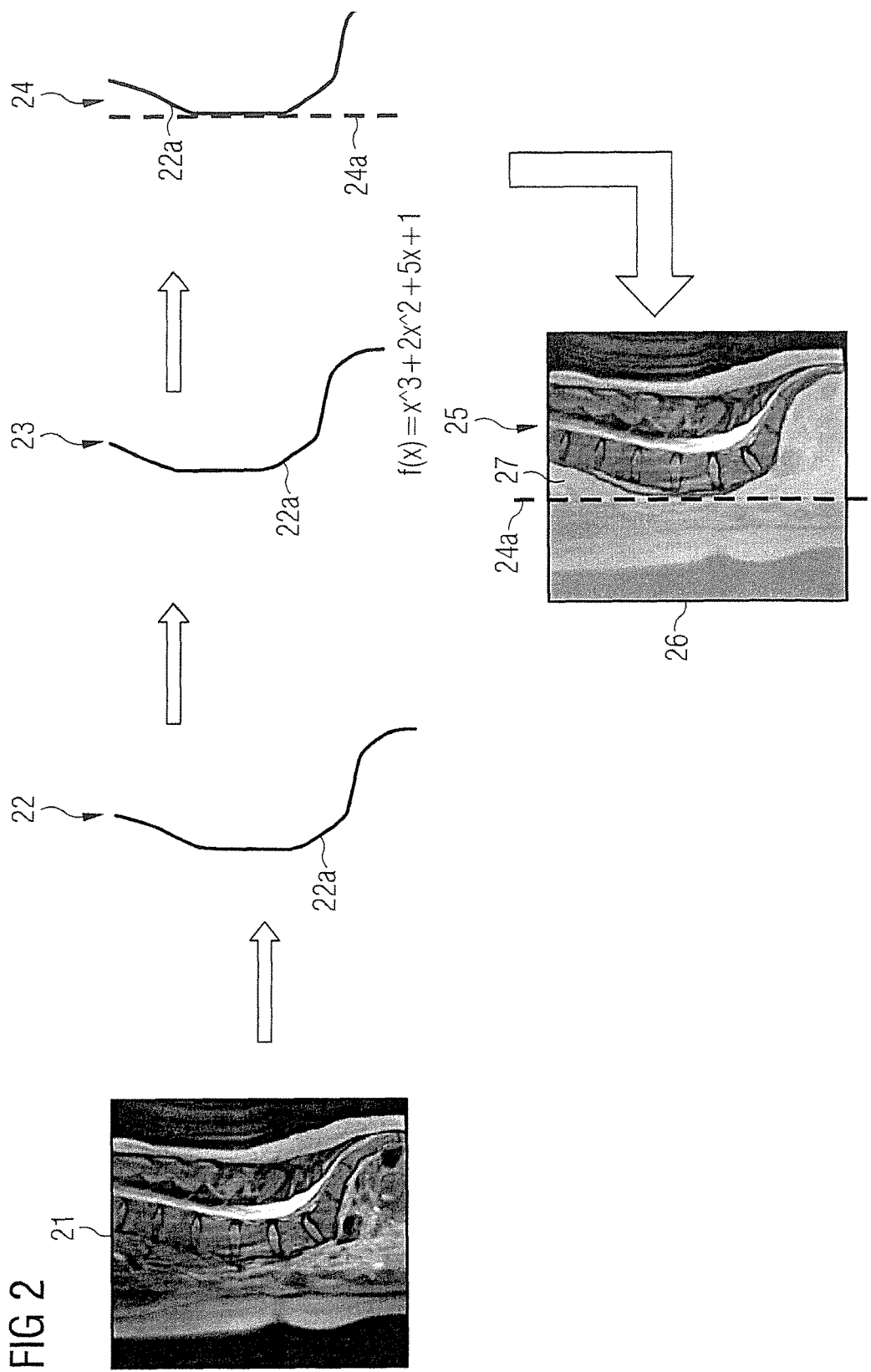
FIG. 2 shows the process of segmenting a region to be examined into a surrounding area and a central area and of applying 1D saturation pulses and nD saturation pulses to the sub-areas.

FIGS. 1 and 2 illustrate a method 100 for determining a control sequence for controlling a magnetic resonance imaging system by means of a saturation pulse sequence according to a first exemplary embodiment of the invention. Whereas in FIG. 1 the method execution sequence is illustrated with the use of a flowchart, in FIG. 2 the individual steps are illustrated by graphic illustrations, in this case the side view of a torso region of a human being. In the flowchart shown in FIG. 1, information in respect of the anatomical structure of a region to be imaged FoV of the examination subject is determined in step 1.I. Corresponding thereto, an image called a localizer is shown in FIG. 2. This serves for generating an overview image 21, from which the anatomical structure of a region to be imaged, in this case a side view of the human torso with spinal column, abdominal region and lower abdomen, can be extracted.

At step 1.II shown in FIG. 1, the region to be imaged FoV is subdivided into surrounding areas 26 and central areas 27 (see FIG. 2, detail drawing 25) dependent on the determined anatomical structure. This step 1.II has a total of four sub-steps 1.IIa, 1.IIb and 1.IIc, 1.IId. At step 1.IIa, a first boundary line of a central area to which an nD saturation pulse is to be applied is specified. This procedure is illustrated in FIG. 2 by means of the detail drawing 22. It can be seen therein that the ventral demarcation line of the spine is defined as the first boundary line 22a. In other words, the central area is in this case the region lying to the left of said first boundary line 22a, to which nD saturation pulses are to be applied. At step 1.IIb, the first boundary line 22a is parameterized. This procedure is illustrated in FIG. 2 in the detail drawing 23. In this case a polynomial f(x) representing the first boundary line 22a is fitted to the actual shape of the first boundary line 22a. At step 1.IIc, finally, a straight demarcation line 24a, which simultaneously represents a second boundary line 24a of the central area, is defined between the central area 27 and the surrounding area 26. Corresponding thereto, a dashed straight vertical line 24a is drawn in the detail drawing 24 in FIG. 2. At step 1.IId, a central area 27 is defined. This is the region to which nD saturation pulses have been applied. In the first exemplary embodiment, the central area 27 is actually defined as the region between the solid first boundary line 22a and the dashed second boundary line 24a. In addition, a surrounding area 26 is also defined in step 1.IId. The surrounding area 26 is the region 26 to which 1D saturation pulses are applied. Although the latter are not as "accurate" as the multidimensional nD saturation pulses, i.e. they do not suppress spurious signals in the surrounding area 26 as effectively as do the nD saturation pulses in the central area 27, the 1D saturation pulses compensate by occupying less time and being significantly more robust in terms of the inhomogeneity of the magnetic fields and the sensitivity of the antenna coils of the MR system than the multidimensional nD saturation pulses. The nD saturation pulses in return have the advantage that they saturate the central area very much more accurately and are less SAR-intensive.

At step 1.III, a one-dimensional water/fat saturation pulse sequence is generated in order to saturate the surrounding area 26. Next, at step 1.IV, a multidimensional water/fat saturation pulse sequence is generated in order to saturate the central area 27.

Figure 3:
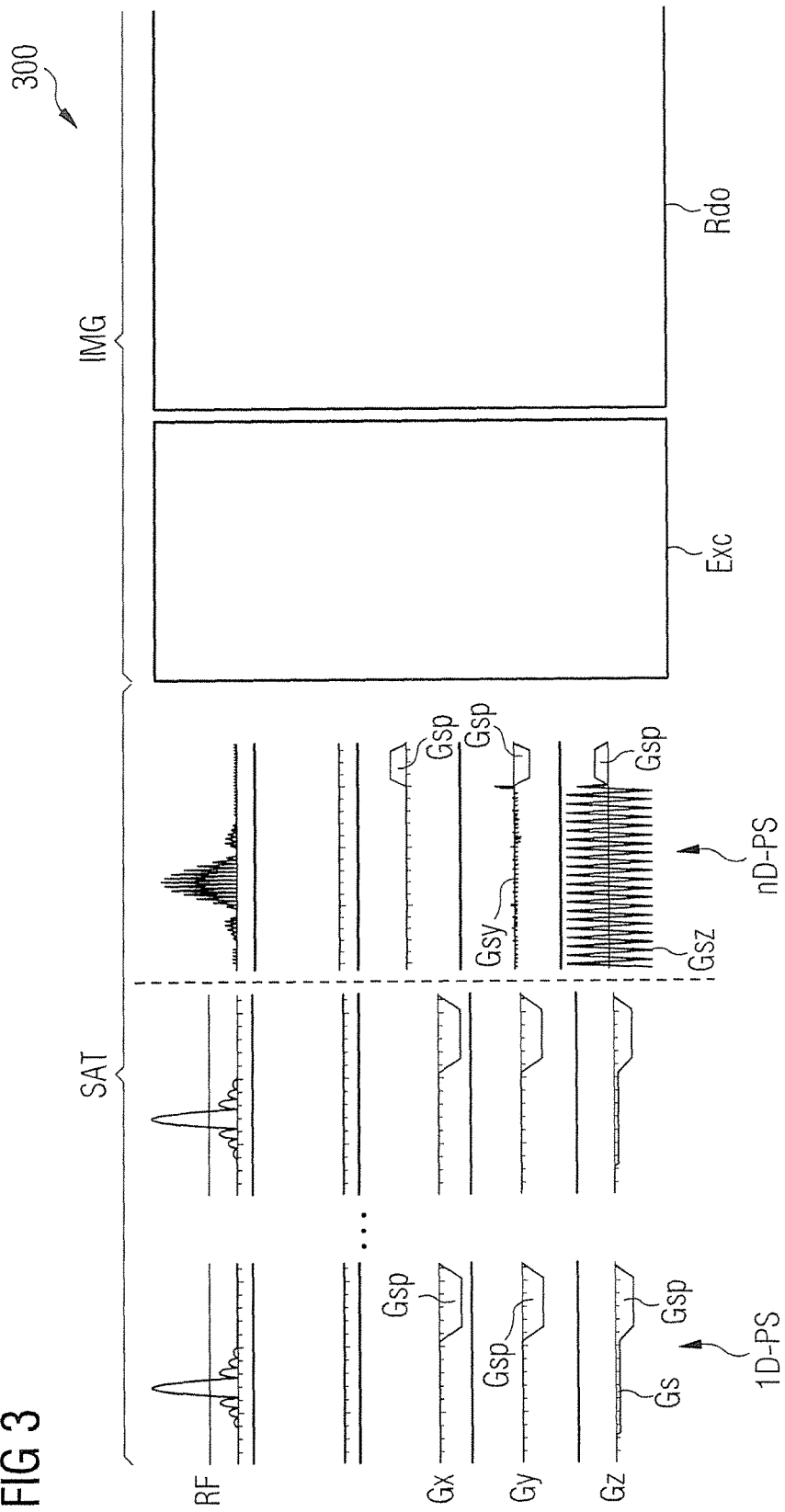
FIG. 3 is a pulse sequence diagram illustrating a pulse sequence that was determined with the use of the method according to the invention.

FIG. 3 shows a pulse sequence diagram 300 illustrating a pulse sequence that has been determined with the use of the method according to the invention. In this case the pulse sequence is divided into a saturation pulse section SAT and an imaging section IMG.

The saturation pulse section is subdivided into a first subsection 1D-PS and a second subsection nD-PS.

In the case shown, the first subsection 1D-PS comprises a plurality of 1D saturation pulse sequences comprising a typically relatively wide-bandwidth RF pulse, indicated in the first line designated by RF, and a slice selection gradient in the z-direction. The relatively wide-bandwidth RF pulse serves to excite magnetic moments of specific materials, such as fat and water for example, in a slice selected by means of the slice selection gradient GS in such a way that the materials (nuclear spins thereof) enter the state of maximum transverse magnetization. In this state the flip angle of the magnetic moments of the selected slice is equal to 90°. In addition, the 1D saturation pulse sequences include multiple field gradients called spoiler gradients Gsp, which are shown in the lines designated by Gx, Gy, Gz following the RF pulse and the slice selection gradient GS in time. These spoiler gradients Gsp dephase the transverse magnetization of the selected slice and thereby neutralize the effect of specific materials contained therein, such as fat and water.

A multidimensional saturation pulse sequence nD-PS is shown in the second subsection nD-PS. The multidimensional saturation pulse sequence nD-PS comprises an RF saturation pulse, which is indicated in the first line designated by RF. In contrast to the one-dimensional RF saturation pulse, this multidimensional RF saturation pulse is relatively narrow in bandwidth, which allows it to act very precisely on certain materials, but also makes it very sensitive to deviations in the magnetic field. In addition, the multidimensional saturation pulse sequence nD-PS also includes a number of selection gradients Gsz and Gsy, which serve for the precise localization of the excitation effect of the RF saturation pulse on a selected region. The multidimensional saturation pulse sequence nD-PS must sample k-space and weight it with the RF pulse in order to implement the nD-spatial selectivity. The form in which k-space is traversed (i.e. raw data are entered therein) is discretionary and independent of the one-dimensional RF saturation pulse 1D-PS. The only proviso is that the sampling should be as quick and efficient as possible. Typically, either serpentine (echo-planar, as in the example) or spiral trajectories are used. With the multidimensional saturation pulses, however, a region can be selected very much more precisely, since the selection is performed multidimensionally and is not just limited to the selection of one slice. In addition, the nD saturation pulse sequence nD-PS includes a number of field gradients called spoiler gradients Gsp, which are shown in the lines designated by Gx, Gy, Gz following the RF pulse and the selection gradients Gsz, Gsy in time. These spoiler gradients Gsp dephase the transverse magnetization of the selected region and thereby neutralize the effect of certain materials contained therein, such as fat and water, for example. The saturation pulse section SAT is followed by the imaging section IMG, which includes the actual imaging pulse sequence, the latter being subdivided into an excitation section Exc and a readout section Rdo.

FIGS. 4 and 5 illustrate a method 400 for determining a control sequence for controlling a magnetic resonance imaging system by means of a saturation pulse sequence according to a second exemplary embodiment of the invention. Whereas in FIG. 4 the method execution sequence is illustrated by a flowchart, in FIG. 5 the specific course of action at step 4.II is illustrated with reference to the region to be imaged FoV.

As to steps 4.I, 4.III and 4.IV, the method 400 illustrated in the flowchart in FIG. 4 proceeds analogously to the method 100 shown in FIG. 1. First, at step 4.I, information is determined in respect of the anatomical structure of the region to be imaged FoV of the examination subject. For this purpose an overview image is generated, for example, from which the anatomical structure of a region to be imaged FoV can be extracted. The region to be imaged FoV is shown in FIG. 5. At step 4.II, however, the detailed course of action is as follows. At step 4.IIa, a central area 27 is first specified in which the object is positioned in the center of interest, in this case a prostate 28. Illustrated on the left side in FIG. 5 is the region to be imaged FoV having the cross-section 41, running parallel to the transverse plane, of a human torso, which is represented as a dashed ellipse. Shown in the central area 27 of the human torso 41 is the human prostate 28. The latter is depicted in an enlarged view on the right side of the diagram in FIG. 5. This central area 27 is chosen as small as possible. The remaining portion of the region to be imaged FoV around the central area, i.e. the surrounding area 26, is split at step 4.IIb into a number of surrounding sub-areas 26a, 26b, 26c, 26d, to which 1D saturation pulses are to be applied. These are specified as strip-like saturation regions oriented at right angles to one another. The surrounding sub-areas 26a, 26b, 26c, 26d overlap one another, though without overlapping the central area 27.

Following specification of the surrounding sub-areas 26a, 26b, 26c, 26d and the central area 27, the pulse sequences for the 1D saturation pulses and the nD saturation pulses are determined at steps 4.III and 4.IV, taking into consideration the specified subareas 26a, 26b, 26c, 26d of the surrounding area 26 and the central area 27.

Figure 6:
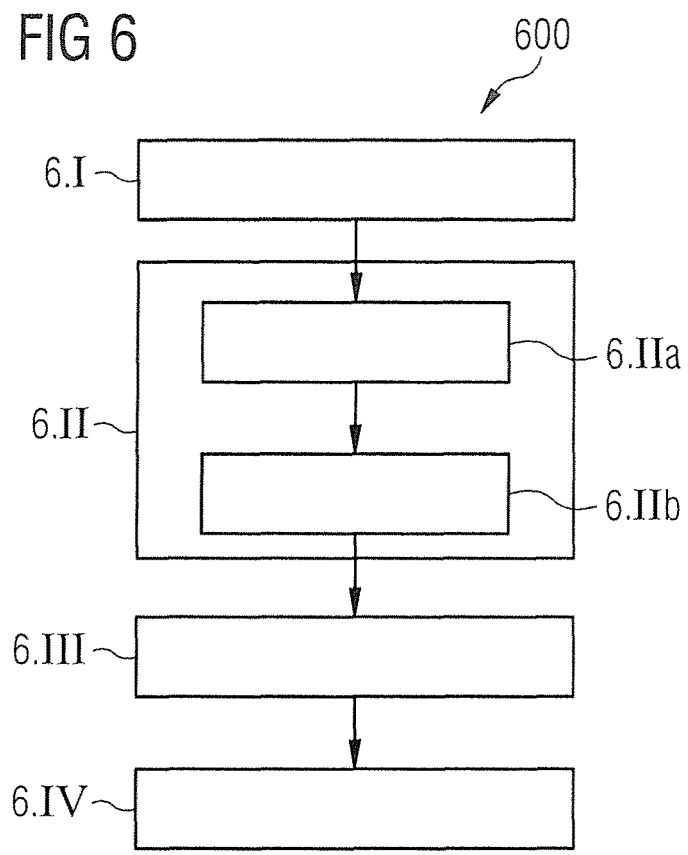
FIG. 6 is a flowchart illustrating a method for determining a control sequence for controlling a magnetic resonance imaging system by a saturation pulse sequence according to a third exemplary embodiment of the invention.
Figure 7:
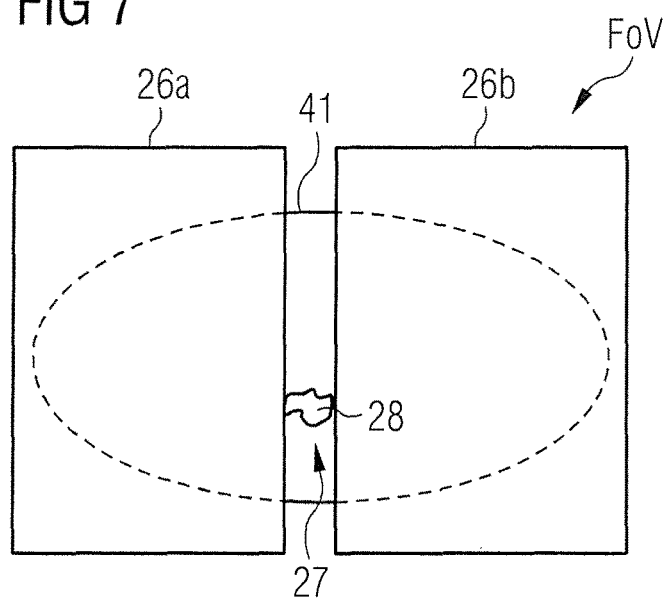
FIG. 7 is a schematic illustration of the application of 1D saturation pulses and nD saturation pulses to the region to be examined in the method according to a third exemplary embodiment of the invention, in a mode called the SAR efficiency mode.

FIGS. 6 and 7 illustrate a method 600 for determining a control sequence for controlling a magnetic resonance imaging system by execution of a saturation pulse sequence according to a third exemplary embodiment of the invention. Whereas in FIG. 6 the method execution sequence is illustrated by a flowchart, in FIG. 7 the specific course of action at step 6.II is illustrated with reference to the region to be imaged FoV.

As to steps 6.I, 6.III and 6.IV, the method 600 illustrated in the flowchart in FIG. 6 proceeds analogously to the method 400 shown in FIG. 4. Firstly, at step 6.I, information with respect to the anatomical structure of the region to be imaged FoV of the examination subject is determined. For this purpose an overview image is generated, for example, from which the anatomical structure of a region to be imaged FoV can be extracted. The region to be imaged FoV is shown in FIG. 6. At step 6.II, however, the detailed course of action is as follows. At step 6.IIa, the central area 27 is not specified in the first instance, but initially the strip-like surrounding sub-areas 26a, 26b are specified, which surround the object positioned in the center of interest, in this case a prostate 28, but do not overlap the object. In the method 600, in contrast to the second embodiment shown in FIG. 4, the surrounding sub-areas 26a, 26b are chosen such that they do not overlap one another. At step 6.IIb, the central area 27, which encompasses the prostate 28, is defined next. This central area encompasses the portion of the region to be imaged FoV that is not covered by the two surrounding areas.

FIG. 7 shows the region to be imaged FoV having the cross-section 41, running parallel to the transverse plane, of a human torso, which is represented as a dark ellipse. A human prostate 28 is shown in the central area 27 of the human torso 41. The human prostate 28 is depicted in an enlarged view on the right side of the diagram in FIG. 6. In this variant of the method according to the invention, however, the central area 27 is not minimized, but is defined as a complementary area to the non-overlapping surrounding subareas 26a, 26b. In this case the central area 27 extends in a vertical direction through the entire field of view FoV.

Following specification of the surrounding subareas 26a, 26b and the central area 27, the pulse sequences for the 1D saturation pulses and the nD saturation pulses are determined at steps 6.III and 6.IV, taking into consideration the specified sub-areas 26a, 26b of the surrounding area 26 and the central area 27.

Figure 8:
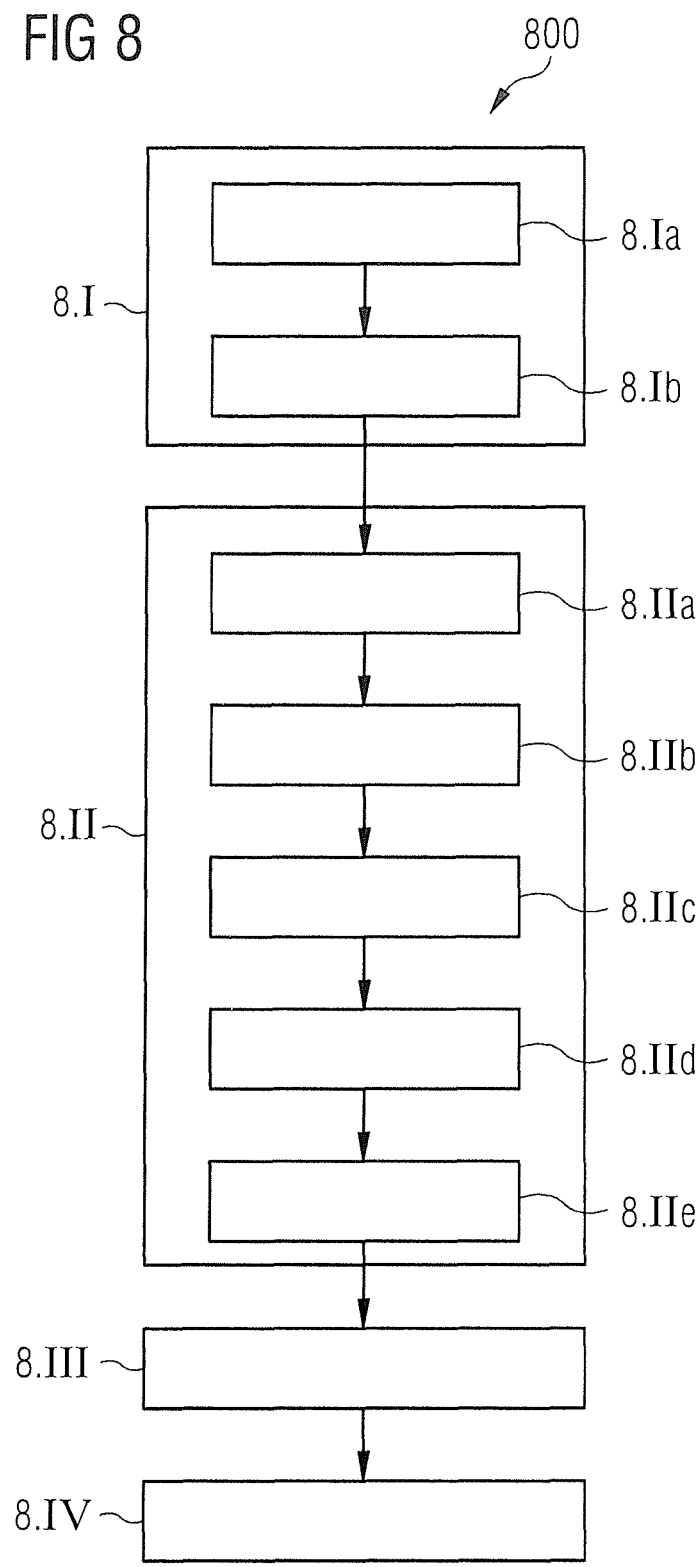
FIG. 8 is a flowchart illustrating a method for determining a control sequence for controlling a magnetic resonance imaging system by a saturation pulse sequence according to a fourth exemplary embodiment of the invention.
Figure 9:
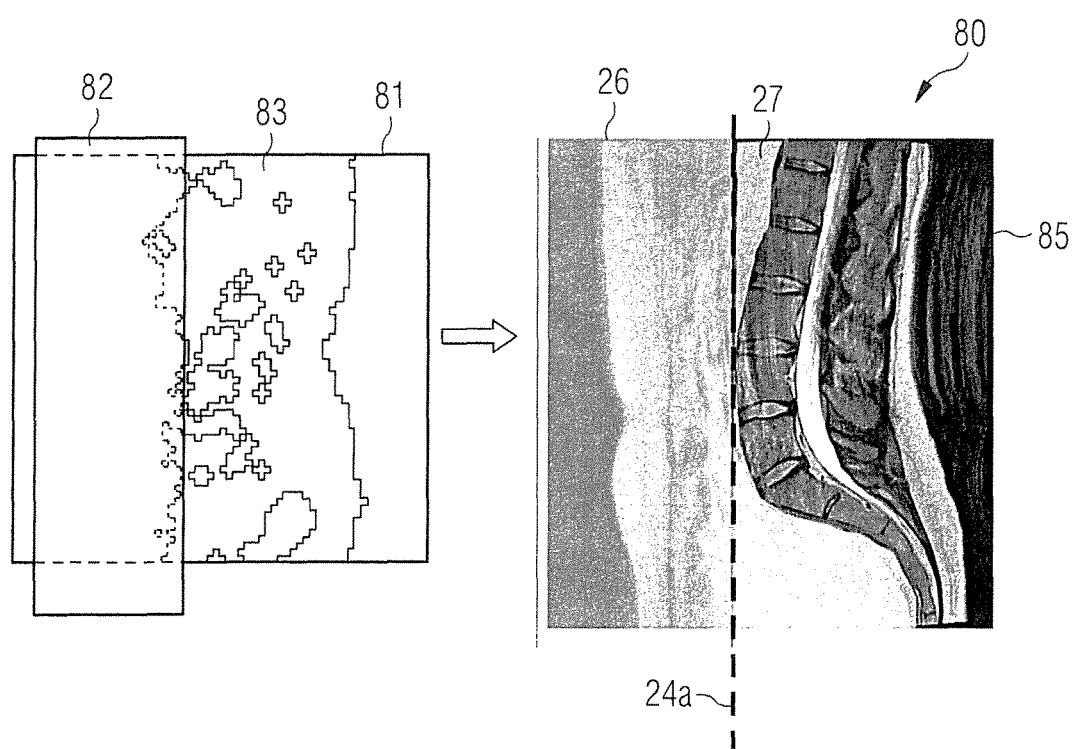
FIG. 9 is a schematic illustration of the application of 1D saturation pulses and nD saturation pulses to the region to be examined in the method according to a fourth exemplary embodiment of the invention, in a mode called the coverage mode.

FIGS. 8 and 9 illustrate a method 800 for determining a control sequence for controlling a magnetic resonance imaging system by execution of a saturation pulse sequence according to a fourth exemplary embodiment of the invention. Whereas in FIG. 8 the method execution sequence is illustrated by a flowchart, in FIG. 9 the specific course of action at steps 8.I and 8.II is illustrated with images of the region to be imaged FoV.

In the flowchart of the method 800 shown in FIG. 8, step 8.I is subdivided into two sub-steps. Whereas at step 8.Ia, as in the case of the method 100, 400, 600, information is also determined with respect to the anatomical structure of a region to be imaged FoV of the examination subject, at the additional sub-step 8.Ib information is determined with respect to the field distribution and homogeneity of the basic magnetic field $B_0$ in the region to be imaged FoV and in respect of the distribution of the sensitivity of the antenna system of the magnetic resonance system used in respect of the variable $B_1$ field. This information is usually determined prior to an acquisition by making adjustment measurements and the resulting information is made available to the user in the form of $B_0$ and $B_1$ maps.

At sub-step 8.IIa of step 8.II, the analysis is now conducted to identify in which areas of the region to be imaged FoV the cited information in respect of the $B_0$ and the $B_1$ sensitivity is present. For example, a corresponding map 81, which comprises a representation of the $B_0$ field and $B_1$ sensitivity information in the region of the torso of a human being in a plane running parallel to the sagittal plane, as is shown on the left side in FIG. 9, can be generated for that purpose. On the right side, in the section 83 of the spine, the map 81 encompasses (represents) regions for which $B_1/B_0$ map material is present, while on the left side a vertically extending region 82 exists for which such data are not present. This situation results from the fact that normally no antennas are attached in the abdominal region and the signals from this area are too weak to obtain information about the $B_0$ field or the $B_1$ sensitivity of the antenna system of a magnetic resonance system in the region 82. Since the 1D saturation pulses prove to be more robust with regard to the absence of $B_0$ and $B_1$ map material, at step 8.IIb the left region 82 is specified as the surrounding area 82, to which 1D saturation pulses are applied. The left region 82 on the map 81 also corresponds to the corresponding area 26 on the anatomical overview image in the right partial image 85 of FIG. 9. At step 8.IIc, as at step 1.IIa, a first boundary line is specified which delimits the central area 27 in the overview image 85 of FIG. 9 toward the right. Next, at step 8.IId, a second straight, vertically extending boundary line is specified which delimits the central area 27 toward the left, i.e. toward the surrounding area 26. Finally, at step 8.IIe, the central area 27 in the overview image 85 is specified as the region lying between the two boundary lines. At the same time the central area 27 is also a region for which sufficient $B_0$ and $B_1$ map material is present, so that the increased requirements of the saturation with the aid of nD pulse sequences with regard to the presence of $B_0$ and $B_1$ field information can be fulfilled.

Following specification of the surrounding area 26 and the central area 27, the pulse sequences for the 1D saturation pulses and the nD saturation pulses are determined at steps 8.III and 8.IV, taking into consideration the specified surrounding area 26 and the specified central area 27.

Figure 10:
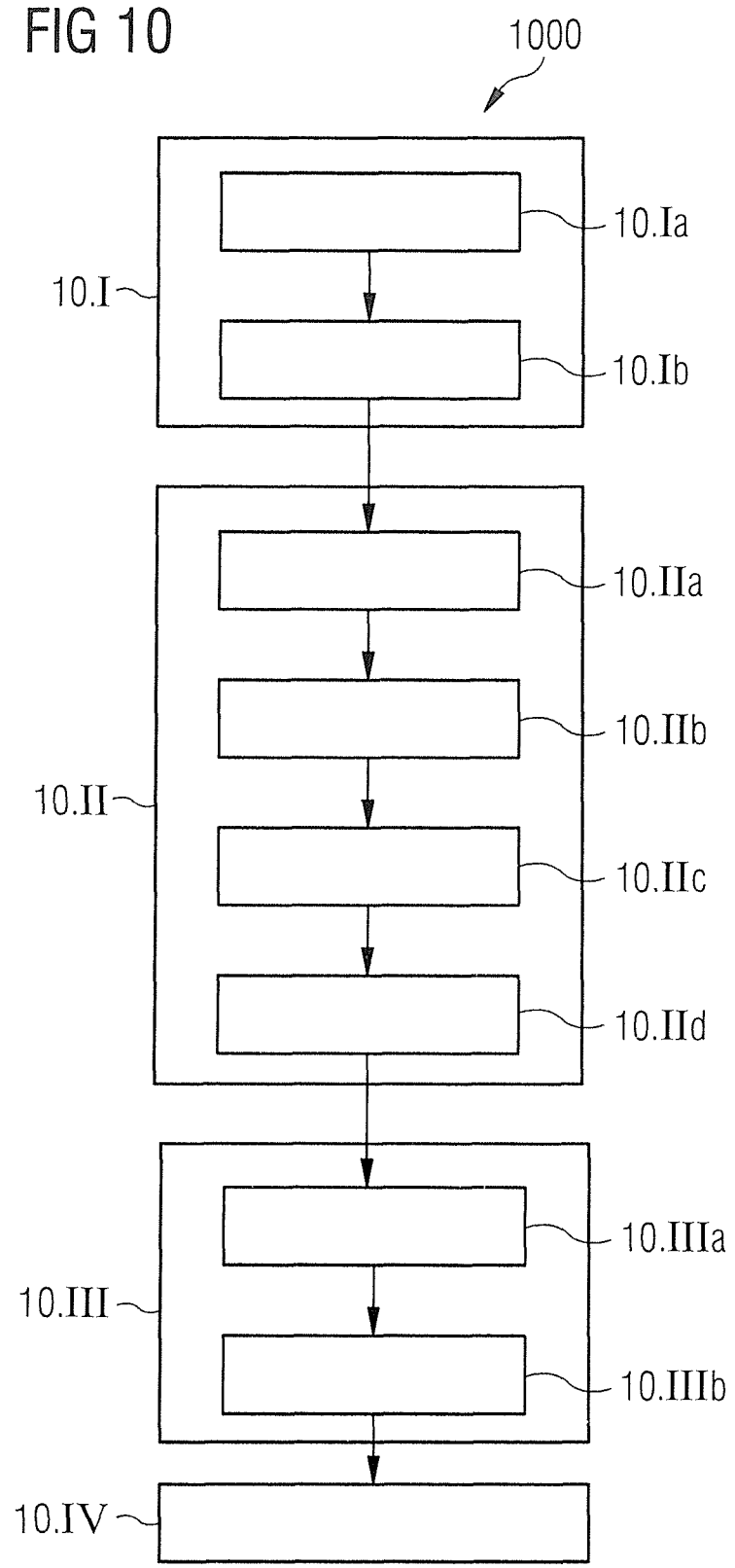
FIG. 10 is a flowchart illustrating a method for determining a control sequence for controlling a magnetic resonance imaging system by means of a saturation pulse sequence according to a fifth exemplary embodiment of the invention.
Figure 11:
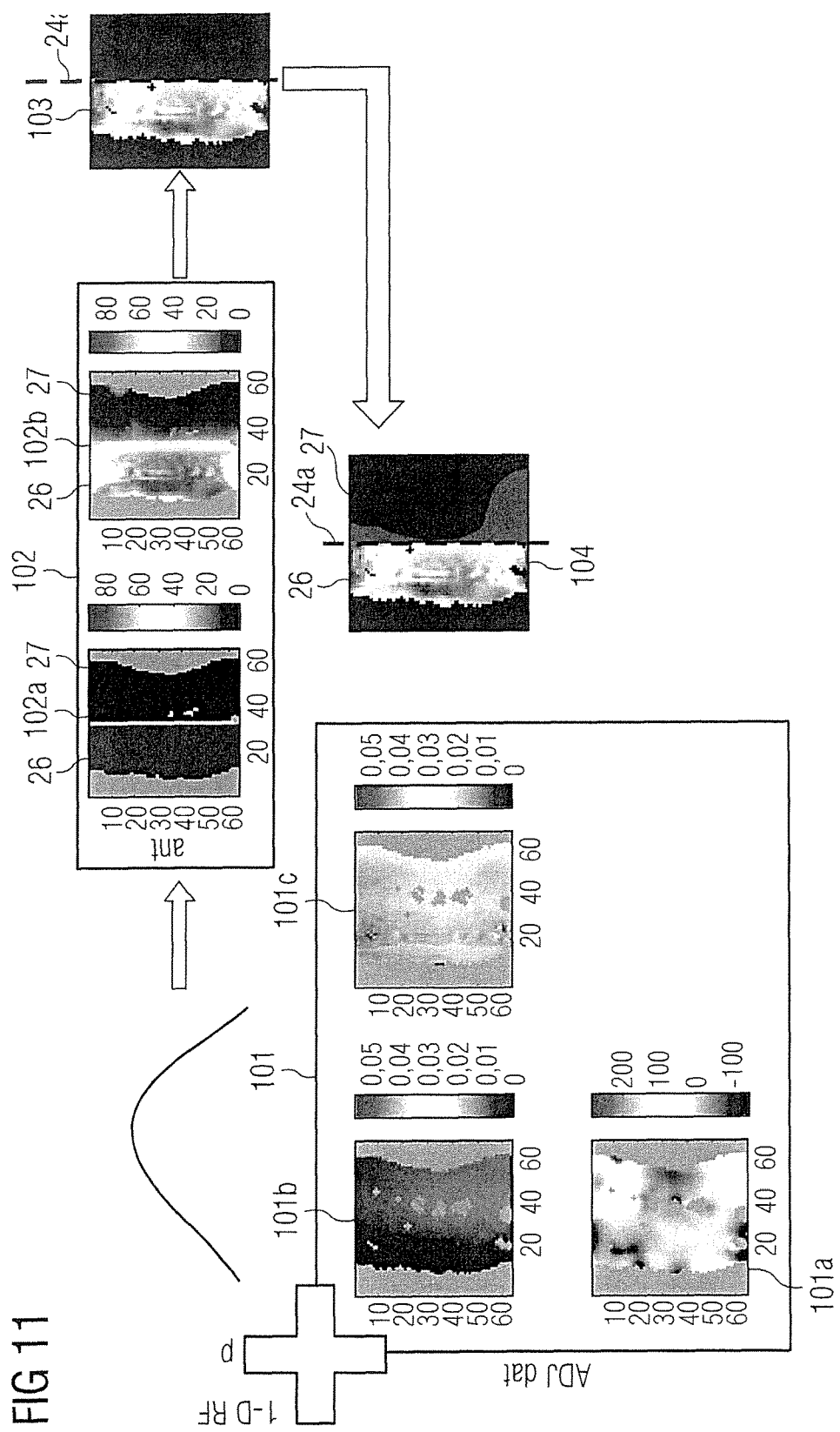
FIG. 11 is a schematic illustration of the application of 1D saturation pulses and nD saturation pulses to the region to be examined in the method according to a fifth exemplary embodiment of the invention, in a mode called the SAT efficiency mode.

FIGS. 10 and 11 illustrate a method 1000 for determining a control sequence for controlling a magnetic resonance imaging system by execution of a saturation pulse sequence according to a fifth exemplary embodiment of the invention. This variant is also referred to as the saturation efficiency mode. As in the case of the fourth exemplary embodiment, map data relating to test measurements in respect of the $B_1$ sensitivity and the $B_0$ sensitivity are incorporated in the method 1000 according to the fifth exemplary embodiment. In addition to the division of the region to be imaged FoV into a surrounding area and a central area on the basis of the available prior information, which can include, for example, the anatomical information or the $B_1$ and $B_0$ maps used in the fourth exemplary embodiment, the test measurements with respect to the $B_1$ sensitivity and the $B_0$ sensitivity are used further in order also to adjust a saturation with the use of nD pulses in the surrounding area in addition to the saturation with the use of the 1D pulses for the suppression of residual spurious signals. In this case the effect of a 1D saturation pulse sequence is simulated for the surrounding area with the use of the acquired prior information, i.e. the suppression of spurious signals in the surrounding area is simulated. The remaining residual spurious signal or, as the case may be, the remaining flip angle in this region is then determined quantitatively and a complementary saturation signal is determined on the basis of an nD saturation pulse sequence by means of which specifically the existing residual spurious signal can be completely eliminated.

Whereas in FIG. 10 the method execution sequence is illustrated by a flowchart, in FIG. 11 the individual sub-steps of step 10.II are illustrated by graphic illustrations.

In the flowchart of the method 1000 shown in FIG. 10, step 10.I is subdivided into two sub-steps. Whereas at step 10.Ia information with respect to the anatomical structure of a region to be imaged FoV of an examination subject is determined, at the additional sub-step 10.Ib information is determined in respect of the field distribution and homogeneity of the basic magnetic field $B_0$ in the region to be imaged FoV and in respect of the distribution of the magnitudes of the sensitivities S1, S2 of the antenna system of the magnetic resonance system used in respect of the variable $B_1$ field. The data determined at step 10.Ib are illustrated graphically in FIG. 11 in the detail drawing 101 as $B_0$ map 101a and $B_1$ maps 101b, 101c with adjustment data ADJ dat in a side view of a patient's torso. This information is usually determined by adjustment measurements prior to an acquisition of diagnostic data, and made available to the user in the form of $B_0$ and $B_1$ maps.

At step 10.II, which is subdivided into a number of sub-steps 10.IIa to 10.IId, the available information is used in order to realize the most accurate water and fat suppression possible. To that end, at step 10.IIa, the known subdivision of the region to be imaged into a surrounding area and a central area is performed. For this purpose, the anatomical information acquired at step 10.Ia can be used, for example as in the methods 100, 400, 600 of the first three exemplary embodiments, in order to specify the surrounding area and the central area. In addition or alternatively, the information determined at step 10.Ib can also be used for specifying the surrounding area and the central area.

At step 10.IIb, a simulation of the generation of a 1D saturation pulse sequence is generated on the basis of the information acquired at step 10.Ib. The result of such a simulation is shown in the partial image 102 in FIG. 11. The target flip angle distribution 102a following the excitation by means of the 1D saturation pulse sequence is shown on the left in the partial image 102. By execution of the 1D saturation pulse sequence, it is desired to obtain a target flip angle of 90° in the surrounding area 26 and to achieve zero excitation, i.e. a target flip angle of 0°, in the central area 27. The result of the simulation of the generation of a 1D saturation pulse sequence is shown in the detail drawing 102b. In this case it can be seen that no exactly homogeneous distribution of the flip angles is achieved in the surrounding area.

At step 10.IIc, a distribution of a residual signal is determined on the basis of the simulation result shown in the partial image 102b. This residual signal is illustrated in the detail drawing 103. What is concerned in this case is the distribution of the remaining spurious signal in the surrounding area 26, i.e. the area to the left of the dashed line 24a, which is complementary to the flip angle distribution in the surrounding area 26 determined at step 10.IIb.

At step 10.IId, a map 104 (see FIG. 10) of a flip angle distribution to be achieved is then determined by execution of an nD saturation pulse sequence. Whereas—as also in the case of the other exemplary embodiments—the goal is to achieve a homogeneous flip angle distribution of 90° in the central area 27, i.e. to the right of the dashed line 24a, the flip angle distribution to be generated with the use of the nD saturation pulse sequence in the surrounding area 26 to the left of the dashed line 24a is complementary to the flip angle distribution achieved in this area in the simulation of the 1D saturation pulse sequence.

Following specification of the flip angle distribution to be achieved with the aid of the nD saturation pulse sequence, a 1D saturation pulse sequence corresponding to the simulation performed in step 10.IIb is generated at step 10.III. At step 10.IV, nD saturation pulses are now determined taking into consideration the map, determined at step 10.IId, of a flip angle distribution to be achieved in the surrounding area 26 and the central area 27.

It is also possible to excite the entire region to be imaged FoV by execution of 1D saturation pulse sequences and subsequently to correct the saturation of the entire region FoV by the use of nD saturation pulses.

Figure 12:
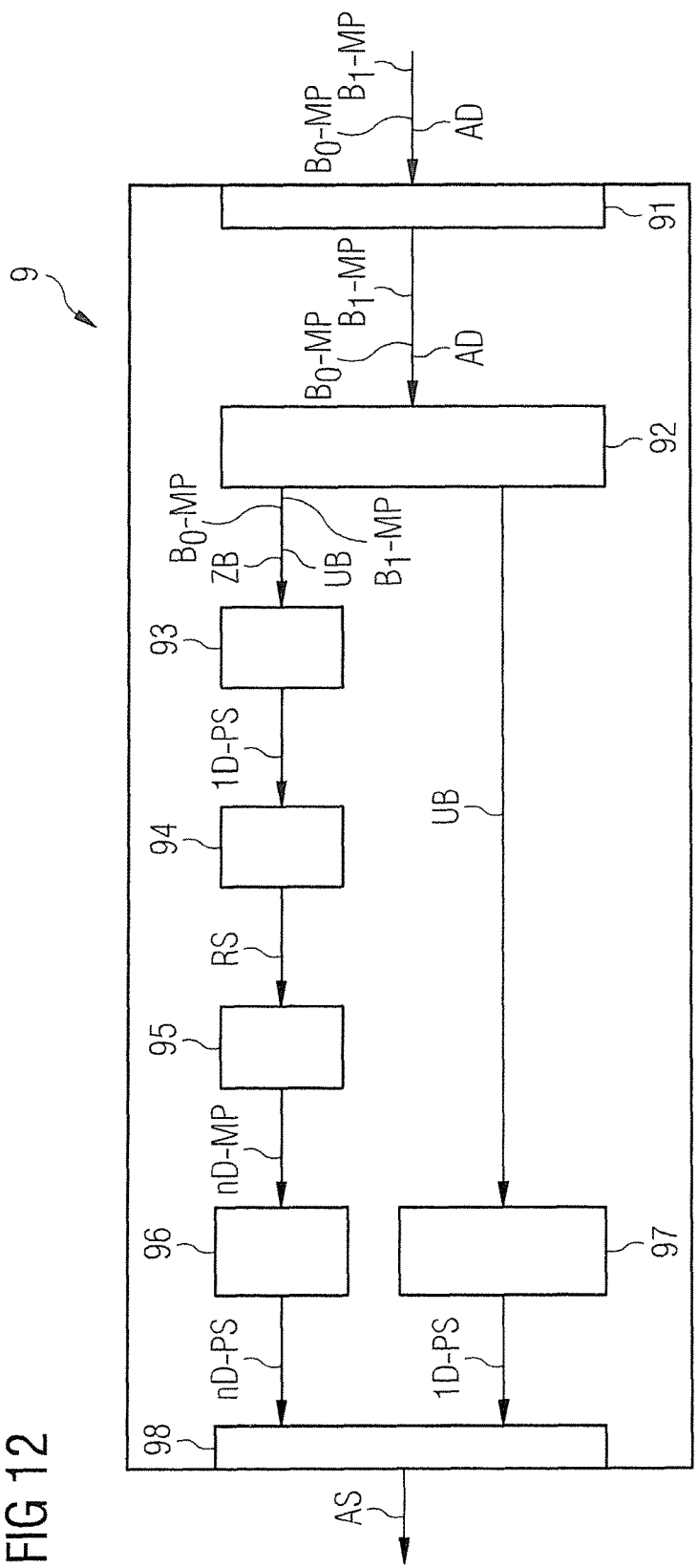
FIG. 12 is a schematic representation of an RF saturation pulse sequence determination device according to an exemplary embodiment of the invention.
Figure 13:
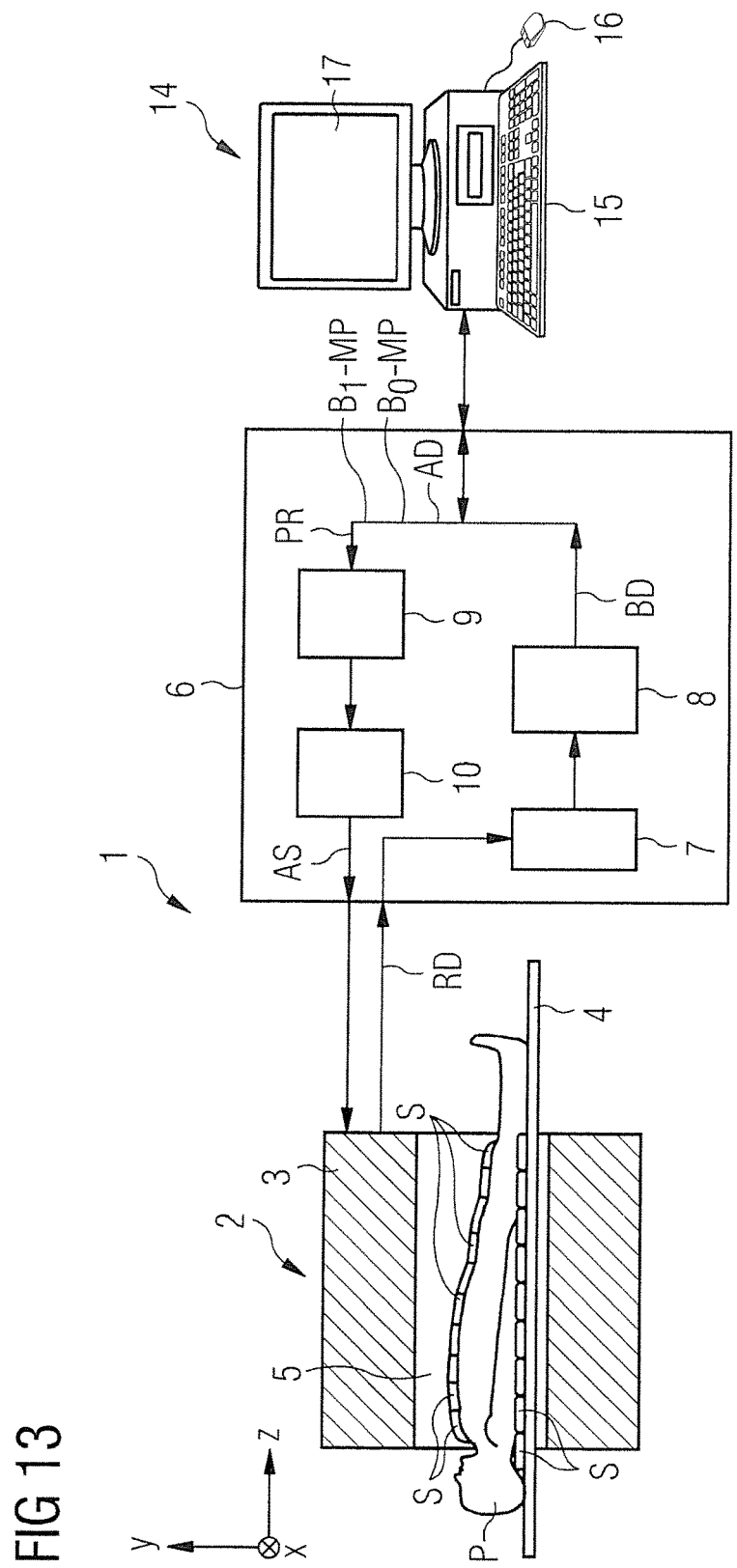
FIG. 13 is a schematic illustration of a magnetic resonance system according to an exemplary embodiment of the invention.

FIG. 12 shows an RF saturation pulse sequence determination computer 9 according to an exemplary embodiment of the invention, which, for example, can be part of a control computer of a magnetic resonance system or magnetic resonance imaging system 1 (see FIG. 13). The RF saturation pulse sequence determination computer 9 has an input interface 91 for receiving information AD with respect to the anatomical structure of a region to be imaged FoV of an examination subject P as well as for receiving adjustment data $B_0$-MP, $B_1$-MP with respect to the previously determined properties of the basic magnetic field $B_0$ and the sensitivity of the antenna system of the magnetic resonance system 1. The acquired data $B_0$-MP, $B_1$-MP, AD are subsequently processed further in a saturation region specification processor 92 in order to subdivide the region to be imaged FoV into surrounding areas UB, 26a, 26b, 26c, 26d and central areas 27, ZB as a function of (dependent on) the determined anatomical structure.

The data UB generated with respect to the delimitation of the surrounding areas are subsequently forwarded both to a 1D saturation pulse determination processor 97 for determining a one-dimensional water/fat saturation pulse sequence 1D-PS for saturating the surrounding areas UB, 26a, 26b, 26c, 26d and to a saturation pulse simulation processor 93. Furthermore, the data ZB generated with respect to the delimitation of the central areas are forwarded to a saturation pulse simulation processor 93. On the basis of the known map data $B_0$-MP, $B_1$-MP, the saturation pulse simulation processor 93 determines a 1D saturation pulse sequence 1D-PS to be applied to the surrounding areas UB. During the simulation, a map of the surrounding areas or—in the case of a single surrounding area—of the surrounding area is generated, which illustrates a distribution of the flip angles α generated in each case by means of the simulated saturation pulse sequence 1D-PS. On the basis of the determined map of the surrounding area, a residual signal determination processor 94 determines a residual signal RS in the surrounding area that is not suppressed by the simulated 1D saturation pulse sequence 1D-PS. The distribution of the residual signal RS is complementary to the distribution of the flip angles, i.e. it corresponds to the deviation of the flip angles from 90°. Subsequently, on the basis of the determined distribution of the residual signal RS and the limits of the central area ZB and of the surrounding area UB, an nD saturation signal distribution determination processor 95 determines a distribution nD-MP of a multidimensional nD saturation signal in the entire region to be imaged FoV. On the basis of the distribution nD-MP of the multidimensional nD saturation signal, an nD saturation pulse determination processor 96 determines a multidimensional water/fat saturation pulse sequence nD-PS for saturating the central area ZB and the surrounding area UB. In this embodiment, the surrounding area UB is therefore saturated precisely with the use of a combination of 1D saturation pulses and nD saturation pulses.

FIG. 13 shows an exemplary embodiment of an inventive magnetic resonance system 1 that is designed to operate according to the inventive method. The magnetic resonance system 1 has a magnetic resonance tomography data scanner 2, in which a patient P is positioned on a patient support table 4 (also referred to as a bed or couch) in a ring-shaped basic field magnet 3 that encloses the measurement chamber 5. A number of local coils S, also called magnetic resonance coils, are located, for example, and, where appropriate, under the patient P.

The support table 4 can be displaced in the longitudinal direction, i.e. along the longitudinal axis of the tomography data scanner 2. This direction is designated in the likewise shown spatial coordinate system as the z-direction. Contained within the basic field magnet 3 in the tomography data scanner 2 is a whole-body coil (not shown in detail) by which radiofrequency pulses are emitted and received. Typically, the tomography data scanner 2 also has gradient coils (not shown) so that a magnetic field gradient can be applied in each of the spatial directions x, y, z.

The tomography apparatus 2 is controlled by a control computer 6, which in this case is depicted as a separate component. A terminal 14 is connected to the control computer 6. The terminal 14 has a screen 17, a keyboard 15 and a pointing device for a graphical user interface, for example a mouse 16 or the like. Among its other functions, the terminal 14 serves as a user interface via which an operator operates the control device 6 and thus controls the tomography data scanner 2. Both the control computer 6 and the terminal 14 can be integrated parts of the tomography data scanner 2.

Furthermore, the magnetic resonance system 1 can include all other typical components or features of such systems, such as e.g. interfaces for connecting a communications network, for example an image information system or the like. For better clarity of illustration, however, none of these known components are shown in FIG. 13.

An operator can communicate with the control computer 6 via of the terminal 14 and thus take responsibility for performing the desired measurements by, for example, ensuring that the tomography data scanner 2 is controlled by the control computer 6 such that the necessary radiofrequency pulse sequences are transmitted by the radiofrequency coils, and the gradient coils are switched in a suitable manner. The raw data RD coming from the tomography data scanner 2 and required for the imaging are also acquired by operation of the control computer 6. For this purpose the control computer 6 has a raw data generation processor 7 in which measured signals arriving from the tomography data scanner 2 are converted into raw data RD. This is accomplished by a digitization of the measured signals, for example. Raw data RD are reconstructed into image data BD in a signal evaluation processor 8, which can be e.g. a module of the control computer 6. The image data BD can be visualized, for example, on the screen 17 of the terminal 14 and/or stored in a memory, or can be sent over a network. In order to carry out the method according to the invention, the control computer 6 has a control sequence determination processor or RF saturation pulse sequence determination processor 9 by which a control sequence AS is determined that is, for example, the pulse sequence shown in FIG. 3 in the diagram 300. For example, the control sequence determination processor 9 receives from the terminal 14 protocol data PR, which contains predetermined parameter values of a pulse sequence that is to be determined, and information AD in respect of the anatomical structure of a region to be imaged FoV of an examination subject P, as well as information with respect to adjustment data $B_0$-MP, $B_1$-MP. The control computer 6 also has a control sequence generation processor 10, which is configured to execute a control sequence AS that has been generated on the basis of the inventive determination method on the magnetic resonance tomography apparatus 2 for the purpose of carrying out the inventive method 100, 400, 600, 800, 1000 for controlling a magnetic resonance imaging system in order to generate magnetic resonance image data BD of an examination subject P.

At least some or all of the components necessary for implementing the invention in a magnetic resonance system 1, such as the control sequence determination processor 9 or the control sequence generation processor 10, can be in the form of software components that respectively execute algorithms to perform the various method embodiments described above. Conventional magnetic resonance systems include programmable control devices in any case, so the invention can be realized in this way preferably with the use of suitable control software. A non-transitory data storage medium encoded with program code (programming instructions) for performing the inventive method 100, 400, 600, 800, 1000 is loaded directly into the memory of the programmable control computer 6 of the magnetic resonance system 1. In this way, existing magnetic resonance systems can also be easily and cost-effectively retrofitted.

In particular it is possible for some of the components to have been realized also as subroutines in components that are already present in the control computer 6 or for existing components to be used in addition for the inventive purpose. This relates, for example, to the control sequence determination computer 9, which can be implemented, for example, in a control sequence generation computer 10 which is already present in an existing control computer 6 and which is intended for driving the radiofrequency coils, gradient coils or other components in the tomography apparatus in a suitable manner in order to perform a typical imaging measurement.

The method according to the invention for determining a control sequence for controlling a magnetic resonance imaging system in order to generate magnetic resonance image data BD of a region to be imaged FoV of an examination subject P can be very flexibly adapted to satisfy the most diverse requirements. As illustrated by the exemplary embodiments, the method can be fine-tuned for time efficiency, anatomical accuracy, SAR efficiency, high saturation efficiency or the presence of data referred to as adjustment data. For this reason the method has a wide field of application, while embodying significant improvements in respect of the cited criteria compared to the conventional methods.

The methods and devices described in the foregoing are merely preferred exemplary embodiments of the invention and the invention can be varied by those skilled in the art without departing from the scope of the invention. Thus, the method and the determination computer have been explained primarily on the basis of the visualization of the torso region. It goes without saying that saturation pulse sequences for other regions of persons or objects to be examined can also be generated by execution of the method and operation of the determination computer. The application of the invention is also not limited to the acquisition of medical image data. For completeness, the use of the indefinite articles "a" or "an" does not exclude the possibility that the features in question may also be present more than once. Equally, the term "unit" does not rule out the possibility of formation by multiple components that, where appropriate, may also be spatially distributed.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining a control sequence for operating a magnetic resonance data acquisition scanner of a magnetic resonance imaging system in order to acquire magnetic resonance raw data from a region to be imaged of an examination subject, comprising:
   using a computer to determine information describing an anatomical structure in said region to be imaged;
   in said computer, specifying a surrounding area and a central area in said region to be imaged, dependent on the determined anatomical structure;
   in said computer, determining a one-dimensional saturation pulse sequence designed to one-dimensionally saturate nuclear spins only in said surrounding area;
   in said computer, determining a multi-dimensional saturation pulse sequence designed to multi-dimensionally saturate nuclear spins only in the central area; and
   making the one-dimensional saturation pulse sequence and the multi-dimensional saturation pulse sequence available from the computer in electronic form in a control sequence configured to operate the magnetic resonance data acquisition scanner to acquire said magnetic resonance raw data from said region to be imaged.

2. A method as claimed in claim 1 comprising using said computer to determine said anatomical structure by executing an automated segmentation algorithm in said computer that segments said anatomical structure from said region to be imaged.

3. A method as claimed in claim 1 comprising using said computer to obtain said anatomical structure information by executing an auto-align method.

4. A method as claimed in claim 1 comprising, in said computer, executing an automated algorithm that parameterizes acquired anatomical coordinates followed by spatial adaptation of multiple one-dimensional radio-frequency (RF) saturation pulses of said one-dimensional saturation pulse sequence, and spatial adaption of multi-dimensional RF saturation pulses in said multi-dimensional saturation pulse sequence, to fit said parameterized anatomical structure.

5. A method as claimed in claim 4 comprising, in said computer, automatically aligning said one-dimensional Rf saturation pulses along the tangent of a geometric curve in a maximum of six directions, and using the multi-dimensional RF saturation pulses to change any remaining fine structures in said central area.

6. A method as claimed in claim 4 wherein said magnetic resonance data acquisition scanner comprises a basic field magnet that generates a basic magnetic field $B_0$ in said magnetic resonance data acquisition scanner, and an RF radiator that radiates at least said one-dimensional RF saturation pulses to produce a $B_1$ field in said magnetic resonance data acquisition scanner, said RF radiator having a $B_1$ sensitivity, and wherein said method comprises providing said computer with at least one map selected from the group consisting of a $B_0$ map that represents a spatial distribution of $B_0$ field, and a $B_1$ map that represents a spatial distribution of said $B_1$ sensitivity, and configuring said one-dimensional RF saturation pulses to saturate any sub-areas of said region to be imaged that are insufficiently covered by said at least one map.

7. A method as claimed in claim 1 comprising determining said surrounding areas to satisfy a criterion of said surrounding areas having a smallest possible overlap with each other and a smallest possible overall surface area.

8. A method as claimed in claim 1 wherein said magnetic resonance data acquisition scanner comprises a basic field magnet that generates a basic magnetic field $B_0$ in said magnetic resonance data acquisition scanner, and an RF radiator that radiates at least said one-dimensional RF saturation pulses to produce a $B_1$ field in said magnetic resonance data acquisition scanner, said RF radiator having a $B_1$ sensitivity, and wherein said method comprises:
  in said computer, generating adjustment data from at least one $B_0$ map that represents a spatial distribution of said $B_0$ field and from at least one $B_1$ map that represents a spatial distribution of said $B_1$ sensitivity, and using said adjustment data to simulate a one-dimensional saturation in said surrounding area;
  in said computer, determining a map of a residual signal that is complementary to the simulated 1D saturation in the surrounding area;
  in said computer, integrating said map of said residual signal into a multi-dimensional saturation target map for a multi-dimensional saturation signal to be generated by said multi-dimensional saturation pulse sequence; and
  determining said multi-dimensional saturation pulse sequence dependent on said multi-dimensional saturation target map.

9. A method as claimed in claim 1 comprising determining radio-frequency (RF) saturation pulses in at least one of said one-dimensional saturation pulse sequence and said multi-dimensional saturation pulse sequence by executing an optimization algorithm that optimizes said RF saturation pulses with regard to a minimum duration of said RF saturation pulses.

10. A method as claimed in claim 1 comprising presenting said one-dimensional saturation pulse sequence and said multi-dimensional saturation pulse sequence at an interface in communication with said computer, and allowing, via said interface, a user selection dependent on the presented saturation pulse sequences.

11. A method for acquiring magnetic resonance raw data from a region to be imaged of an examination subject situated in a magnetic resonance data acquisition scanner of a magnetic resonance imaging system, said method comprising:
  using a computer to determine information describing an anatomical structure in said region to be imaged;
  in said computer, specifying a surrounding area and a central area in said region to be imaged, dependent on the determined anatomical structure;
  in said computer, determining a one-dimensional saturation pulse sequence designed to one-dimensionally saturate nuclear spins only in said surrounding area;
  in said computer, determining a multi-dimensional saturation pulse sequence designed to multi-dimensionally saturate nuclear spins only in the central area;
  from the computer, operating the magnetic resonance data acquisition scanner to acquire said magnetic resonance raw data from said region to be imaged by executing the one-dimensional saturation pulse sequence and the multi-dimensional saturation pulse sequence; and
  making the acquired magnetic resonance raw data available from the computer in electronic form as a data file.

12. A radio-frequency (RF) saturation pulse sequence determination device for determining a control sequence for controlling a magnetic resonance data acquisition scanner of a magnetic resonance imaging system in order to acquire magnetic resonance raw data from a region to be imaged of an examination subject, said device comprising:
  a computer configured to determine information describing an anatomical structure in said region to be imaged;
  said computer being configured to specify a surrounding area and a central area in said region to be imaged, dependent on the determined anatomical structure;
  said computer being configured to determine a one-dimensional saturation pulse sequence designed to one-dimensionally saturate nuclear spins only in said surrounding area;
  said computer being configured to determine a multi-dimensional saturation pulse sequence designed to multi-dimensionally saturate nuclear spins only in the central area; and
  said computer being configured to make the one-dimensional saturation pulse sequence and the multi-dimensional saturation pulse sequence available from the computer in electronic form in a control sequence configured to operate the magnetic resonance data acquisition scanner to acquire said magnetic resonance raw data from said region to be imaged.

13. A magnetic resonance system comprising:
  a magnetic resonance data acquisition scanner;
  a control computer configured to operate the magnetic resonance data acquisition scanner in order to acquire magnetic resonance raw data from a region to be imaged of an examination subject while the examination subject is situated in the magnetic resonance data acquisition scanner;
  said computer configured to determine information describing an anatomical structure in said region to be imaged;
  said computer being configured to specify a surrounding area and a central area in said region to be imaged, dependent on the determined anatomical structure;
  said computer being configured to determine a one-dimensional saturation pulse sequence designed to one-dimensionally saturate nuclear spins only in said surrounding area;

said computer being configured to determine a multi-dimensional saturation pulse sequence designed to multi-dimensionally saturate nuclear spins only in the central area; and said computer being configured to make the one-dimensional saturation pulse sequence and the multi-dimensional saturation pulse sequence available from the computer in electronic form in a control sequence configured to operate the magnetic resonance data acquisition scanner to acquire said magnetic resonance raw data from said region to be imaged.

14. A non-transitory, computer-readable data storage medium encoded with programming instructions, said storage medium being loaded into a control computer of a magnetic resonance imaging system that comprises a magnetic resonance data acquisition scanner, said programming instructions causing said control computer to:

operate the magnetic resonance data acquisition scanner to acquire magnetic resonance raw data from a region to be imaged of an examination subject while the examination subject is situated in the magnetic resonance data acquisition scanner;

determine information describing an anatomical structure in said region to be imaged;

specify a surrounding area and a central area in said region to be imaged, dependent on the determined anatomical structure;

determine a one-dimensional saturation pulse sequence designed to one-dimensionally saturate nuclear spins only in said surrounding area;

determine a multi-dimensional saturation pulse sequence designed to multi-dimensionally saturate nuclear spins only in the central area; and make the one-dimensional saturation pulse sequence and the multi-dimensional saturation pulse sequence available from the computer in electronic form in a control sequence configured to operate the magnetic resonance data acquisition scanner to acquire said magnetic resonance raw data from said region to be imaged.

* * * * *